United States Patent [19]

Baratte et al.

[11] Patent Number: 5,183,767
[45] Date of Patent: Feb. 2, 1993

[54] METHOD FOR INTERNAL GETTERING OF OXYGEN IN III-V COMPOUND SEMICONDUCTORS

[75] Inventors: Herve Baratte, Hofheim, Fed. Rep. of Germany; Joel P. de Souza, Porto Alegre, Brazil; Devendra K. Sadana, Plesantville, N.Y.

[73] Assignee: International Business Machines Corporation, Armonk, N.Y.

[21] Appl. No.: 655,512

[22] Filed: Feb. 14, 1991

[51] Int. Cl.$^5$ .......................................... H01L 21/306
[52] U.S. Cl. ...................................... 437/11; 437/934; 437/987; 148/DIG. 24
[58] Field of Search ............... 437/10, 11, 12, 912, 437/934, 987; 148/DIG. 23, DIG. 24, DIG. 40, DIG. 56, DIG. 60

[56] References Cited

U.S. PATENT DOCUMENTS

| | | | |
|---|---|---|---|
| 3,647,389 | 3/1972 | Weiner | 437/12 |
| 3,725,284 | 4/1973 | Touchy | 437/10 |
| 3,756,955 | 9/1973 | Touchy | 437/987 |
| 3,974,002 | 8/1976 | Casey, Jr. et al. | 437/12 |
| 4,383,869 | 3/1983 | Liu | 437/934 |
| 4,426,237 | 1/1984 | Freeouf et al. | 437/987 |
| 4,602,965 | 7/1986 | McNally | 437/912 |

OTHER PUBLICATIONS

Farley et al., "Co-Implantation and Autocompensation in close contact Rapid Thermal Annealing of Si-Implanted GaAs:Cr," Jnl. of Electronic Materials, vol. 16, No. 1, 1987, pp. 79-85.

Primary Examiner—Brian E. Hearn
Assistant Examiner—C. Chaudhari
Attorney, Agent, or Firm—Scully, Scott, Murphy & Presser

[57] ABSTRACT

A method and article of manufacture are disclosed comprising substantially increasing the electrical activation and mobility of electrons in a III-V semiconductor material containing minor amounts of oxygen by doping a III-V crystalline material with an n-type dopant and adding or implanting an oxygen reactive element in the III-V material where the doses of dopant and implanted oxygen reactive element are low enough to effect this increase. These doses typically do not exceed about 1E13 cm$^{-2}$ and 4.5E12 cm$^{-2}$ respecitvely. The added or implanted oxygen reactive element preferably is at a dose less than the n-type dopant. Experimental data indicate that the added or implanted oxygen reactive element acts as a gettering agent to form an oxygen depleted zone between dopant and oxygen reactive element regions.

22 Claims, 5 Drawing Sheets

METHOD FOR INTERNAL GETTERING OF OXYGEN IN III-V COMPOUND SEMICONDUCTORS

TECHNICAL FIELD

The technical field to which this invention relates is a method of placing an n-dopant in a III-V compound with an added oxygen reactive element to form a semiconductor with improved activation and electron mobility. The invention also relates to gettering oxygen from a III-V compound, especially a III-V compound semiconductor by means of an added oxygen reactive element to obtain this improvement.

PRIOR ART

C. W. Farley et al., *Journal of Electronic Materials*, Vol. 16, No. 1, 1987, p. 79 describes the close contact rapid thermal annealing of semi-insulating GaAs:Cr implanted with Si, Si+Al and Si+P. Farley et al. acknowledged that co-implantation of Group III (e.g. Al) and Group V (e.g. P) elements with Si influenced its donor or acceptor activity according to the prior art and refined earlier reported results in this respect. Each of the Si, Al and P implants was at a dose of 1E14 $cm^{-2}$.

Casey, Jr. et al. U.S. Pat. No. 3,974,002 describes the use of aluminum as a gettering agent in MBE fabrication of heterostructure junction lasers based on GaAs compounds. FIG. 3B of Casey illustrates alternating regions of GaAs and $Al_{0.25}Ga_{0.75}As$, i.e. a structure in which the aluminum gettering agent is employed in doses of about 25%.

Freeouf et al. U.S. Pat. No. 4,426,237 describes a method for growing GaAs by molecular beam epitaxy wherein Al is added to the Ga source crucible in order to improve Mg doping efficiency. No more than about 0.1% Al is included in the Ga source material e.g. $10^{-3}$ mole Al/mole GaAs. The patentees note that aluminum contamination of the GaAs region that is formed does not present a problem since the aluminum is used in such small amounts.

Weiner U.S. Pat. No. 3,647,389 describes the use of aluminum as a gettering agent in the growth of III-V semiconductor crystals by means of a liquid encapsulation method where boric oxide is used as the encapsulant.

Castl et al. in IBM Technical Disclosure Bulletin Vol. 12, Apr. 11, 1970 describe a method for gettering fast diffusing impurities from semiconductor materials by depositing aluminum on the back of a silicon wafer after the opposite side is processed to form an integrated circuit or similar device. The resultant structure is heat treated at a temperature of about 600° C. for about one-half hour and during heat treatment the fast diffusing impurities within the silicon, such as copper, are removed by the gettering action of the aluminum film.

Poponiak et al., IBM Technical Disclosure Bulletin, Vol. 16, Sept. 4, 1973 describe a gettering technique by which a damaged region or region is created in a semiconductor body for gettering purposes without materially disturbing the device regions. Nonconductive impurities such as Ge and Sn are ion implanted into a monocrystalline semiconductor body at an energy sufficient to cause penetration to a distance significantly below the surface. A damaged region or region is formed thereby, and afterwards the semiconductor is heated at a temperature and for a time sufficient to anneal the defects above the damaged region.

Dinklage et al. IBM Technical Disclosure Bulletin Vol. 19, Apr. 11, 1977 describe a process for gettering by ion implantation. Impurities are gettered in a silicon semiconductor wafer of a given conductivity type having an oxide region, such as a doped silicon oxide region disposed on a first or front surface of the wafer. A damaged region is formed by implanting ions into the wafer through the second or back surface of the wafer to a depth no closer to the first surface than the deepest depletion region of devices such as field-effect transistors, to be later formed in the first surface. Ions which may be implanted include $B^+$, $P^+$, $Ar^+$, $O^+$, $Xe^+$, $Si^+$, $N^+$ or $As^+$.

SUMMARY OF THE INVENTION

The present invention comprises a method for improving both the electrical activation and mobility of electrons in semiconductor materials such as III-V materials and the article of manufacture obtained thereby. It has been found that when n-type dopants are introduced into a III-V semiconductor crystal having minor amounts of oxygen as an impurity, and an oxygen reactive element co-implanted in a region opposite the dopant region, that both the electrical activation and mobility of the electrons in the semiconductor device thus produced improves markedly and in some instances by more than 20% compared to a control sample where a III-V crystal was implanted with an n-dopant without a co-implanted oxygen reactive element. Although the inventors do not wish to be limited by any theory, it is believed that the implanted oxygen reactive element acts as a gettering agent for the oxygen, to form an oxygen depleted zone between the n-dopant region and the implanted oxygen reactive element region.

Because it is presently believed that the mechanism by which the advantages of the invention are obtained initially, is the gettering of oxygen in the crystal, the implanted element employed in this respect will be referred to as an implanted oxygen reactive element and comprises any element that may be implanted or otherwise added to the III-V crystal or its equivalents, and will have an affinity for, or chemical reactivity with oxygen that is greater than the affinity or chemical reactivity of the III-V constituent atoms with oxygen or the dopant with oxygen. Stated otherwise, the implanted oxygen reactive element will be chosen so that it is more competitive than the III-V constituent atoms or dopant in the reaction with oxygen, i.e. the oxygen will selectively react with the implanted oxygen reactive element exclusively or to a greater degree than with the III-V constituent atoms with oxygen or the dopant with oxygen. Additionally, the implanted oxygen reactive element and the concentration employed, is selected so that it will not interfere with the electrical properties of the substrate (but in fact improve them) and must also be compatible with the process or processes used for forming the article of manufacture made according to the invention.

Therefore, the present invention also relates to a method of gettering oxygen from such a III-V compound by placing a dopant in the compound to form a dopant region and an oxygen reactive element to form an opposed region so that the implanted oxygen reactive element acts as a gettering agent to combine with the oxygen to form an oxygen depleted zone between the regions. The depth of, and space between the regions is sufficient so that oxygen combined with the implanted oxygen reactive element will not substantially interfere with the electrical properties of the dopant.

The dopant and implanted oxygen reactive element are in a sufficiently low dose so that they will improve the electrical properties of the III-V semiconductor thus obtained, the implanted oxygen reactive element, in one embodiment being at a lower dose than the dopant.

In another embodiment of the invention, the dopant region, implanted oxygen reactive element region and oxygen depleted zone are formed so that the oxygen depleted zone also extends from the surface of the dopant region that is opposite the implanted oxygen reactive element region. The dopant region and the implanted oxygen reactive element region may be ion implanted into the III-V compound.

A novel III-V semiconductor article of manufacture is also obtained containing minor amounts of oxygen, a dopant region and an opposed implanted oxygen element region with an oxygen depleted zone between the regions where the regions are spaced and the doses of dopant and implanted oxygen reactive element are as noted above.

DETAILED DESCRIPTION OF THE INVENTION

Figure 1:
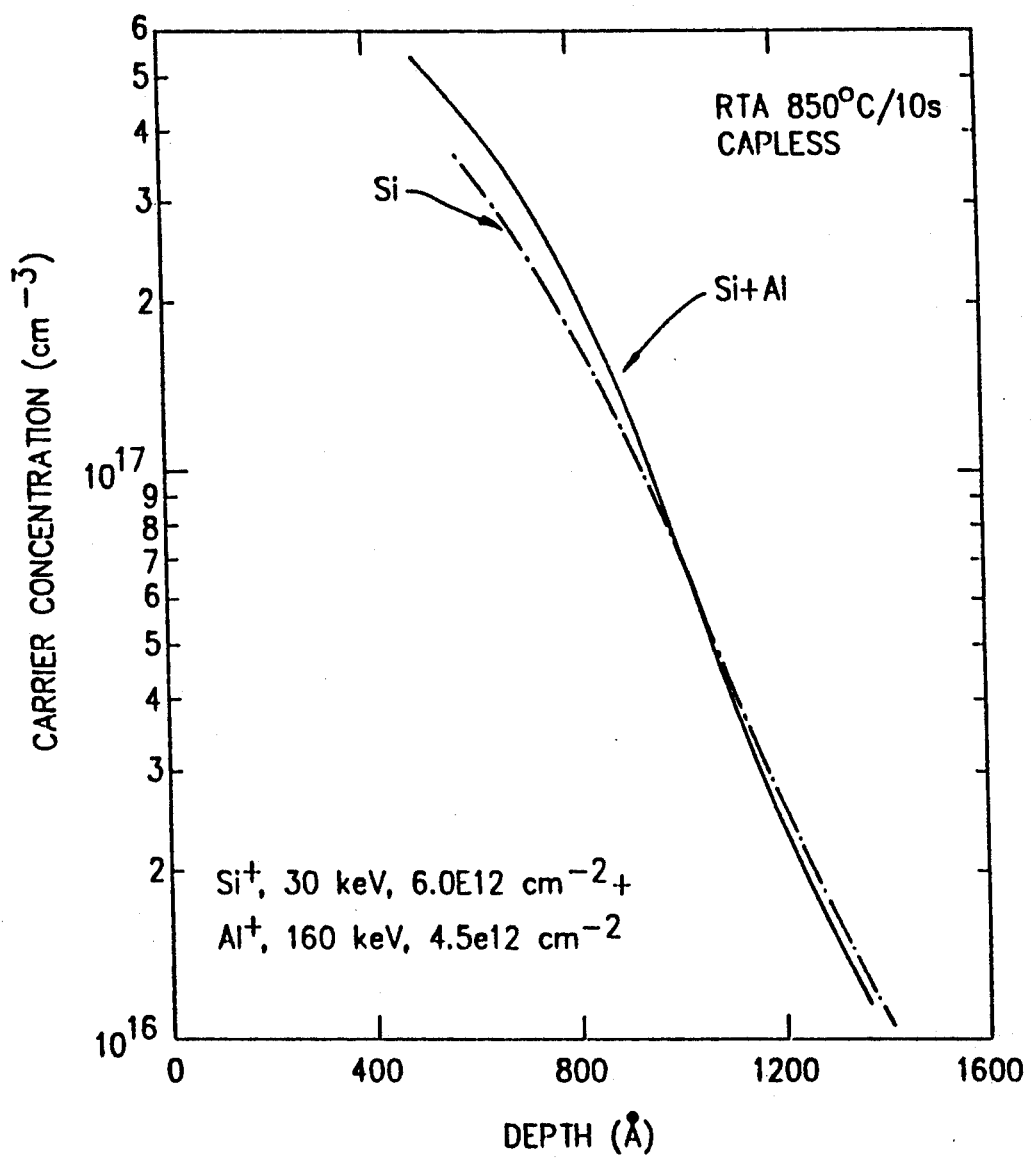
FIG. 1 comprises a plot of carrier concentration (electrons) in cubic centimeters measured by the C-V method along the y axis (ordinate) and the depth in Angstroms (Å) plotted along the x axis (abscissa) for silicon introduced into a GaAs crystalline substrate by ion-beam implantation at 30 keV at a dose of 6.0E12 cm$^{-2}$ and subjected to a rapid thermal anneal (RTA) of 850° C. for 10 seconds by a capless method. The co-implantation of Si at the foregoing concentrations in combination with Al implanted by ion beam implantation at 160 keV at a dose of 4.5E12 cm$^{-2}$ also subjected to RTA at 850° C./10 s in a capless process is also plotted.

Metal - semiconductor - field - effect - transistors (MESFETs) may be constructed from III-V materials such as gallium arsenide doped with an n-type material such as silicon to produce a source and a drain region straddling a channel operatively associated with a gate electrode. Source and drain electrodes are similarly associated with the source and drain regions. The flow of current between the source and the drain electrodes is controlled by the channel and the gate electrode associated with it, which operates in a manner analogous to a switch. The speed with which the device can be switched on and off by the appropriate application of current to the gate electrode depends on the amount of electrical charge and the mobility of the carriers [electrons in the case of n-dopants] in the channel region. If carrier mobility can be improved for the required amount of electrical charge, the MESFET speed of operation can be increased which has significant commercial applications. When a device of this type is employed in a computer circuit, higher speed switching allows for the faster processing of data which is to say an increased output of the computer.

Accordingly, the purpose of the invention is to achieve these and other objectives.

It is also an object of the present invention to provide a method for manufacturing a III-V semiconductor material having improved electrical activation and mobility of electrons and an article of manufacture obtained thereby.

It is a further object of the present invention to provide a method for manufacturing a III-V semiconductor material MESFET having improved electrical activation and mobility of electrons in the channel region and an article of manufacture obtained thereby.

It is a further object of the present invention to obtain the foregoing advantages with a III-V semiconductor material based on GaAs.

It is a further object of the present invention to obtain the foregoing advantages with a III-V semiconductor material that has been doped with an n-type material.

It is a further object of the invention to obtain the forgoing advantages with a III-V semiconductor material that has been doped with silicon.

These and other objectives have been achieved by the method and article of manufacture of the present invention which comprises substantially increasing the electrical activation and mobility of the electrons in a III-V semiconductor material by doping a III-V crystalline material with an n-type dopant and adding or implanting an oxygen reactive element in the III-V material where the doses of dopant and implanted oxygen reactive element are low enough to improve the electrical activation and mobility of the electrons in the III-V semiconductor, especially where these doses do not exceed about 1E13 cm$^{-2}$. In a further embodiment, the added or implanted oxygen reactive element is at a dose substantially less than the n-type dopant and especially at a dose of from about 0.75 to about 0.2 times the dose of the n-type dopant.

Any III-V semiconductor material may be employed although GaAs and InAs materials are preferred, especially GaAs materials and similarly any added or implanted oxygen reactive element may be used according to the invention but especially Al.

In one embodiment, when Si was implanted with Al at doses set forth herein to create a conducting channel in GaAs MESFET's both the electrical activation and mobility of the electrons improved markedly (more than 20%) compared to a control sample where Si was implanted without Al.

The speed of a MESFET device is dependent to a great degree on the channel region of the device and the electric charge and mobility in this channel region. This channel region is semiconductive and in III-V devices typically comprises a Si doped region.

In any given amount of dopant atoms only a fraction are active and as the dose increases the fraction of carriers for activation decreases. It is therefore known that by dropping the dose of the n-dopant such as silicon in this regard that the mobility increases and that a norm is to use about 5E17 cm$^{-2}$ carrier concentration in the channel of a MESFET device. Thus, whereas in the prior art, as the carrier concentration increased the mobility decreased, it has been found by the present invention that when a III-V semiconductor crystal such as GaAs doped with Si is implanted with an oxygen reactive element such as Al, both the carrier concentration and the mobility improve simultaneously. Accordingly, with the implanted oxygen reactive element such as aluminum, the n-dopant such as silicon can be lowered to further increase the mobility. Some of the data in this regard are set forth in FIG. 1.

When employing the method of the present invention to form a channel region in a MESFET device, the electric charge and the mobility in the channel region thus produced is improved in that the charge can be oscillated at a greater rate, the rate of this oscillation being correlated to the speed with which the device can be switched. Thus, by employing the present invention in the channel region of a MESFET device higher speed switching can be obtained which, as noted before, has significant commercial application in computer devices in that the data processing speed and capacity of the device is thereby increased.

Although the inventors do not wish to be limited by any theory, it is believed that the added or implanted oxygen reactive element that is used according to the invention, acts as a gettering agent in semiconductor grades III-V crystalline materials such as GaAs which contains minor amounts of oxygen as an impurity. The data from a control experiment as reported herein indicate that when III-V crystals such as GaAs are implanted with $^{18}O$ and an oxygen reactive element such as Al, that a zone is produced in the GaAs crystal during annealing subsequent to implantation that has a reduced oxygen content i.e. an oxygen depleted zone results. Additional data, also reported herein indicate that the oxygen depleted zone created by the oxygen movement toward the aluminum where the alumunium concentration is the highest.

Although the inventors do not wish to be limited by any theory, it appears that the electrical activation and mobility of the electrons is improved according to the invention where the n-type dopant is introduced into the III-V crystal to form a dopant region and the implanted oxygen reactive element similarly introduced into the III-V compound to form an implanted oxygen reactive region separate from and opposed to the dopant region.

This is not to say however, that there are regions of dopant and implanted oxygen reactive element that do not intermix. They do, but it is the regions of peak dose of each that are maintained at a distance from one another which is what is intended when the invention is described in terms of the dopant and the implanted oxygen reactive element being in regions opposite to one another and separated from one another.

It has been found that by forming a substantially oxygen depleted zone between a dopant region and an opposed implanted oxygen reactive element region in such III-V compounds, especially where the oxygen depleted zone also extends from the surface of the dopant region that is opposite the implanted oxygen reactive element region, that both the electrical activation and the mobility of the electrons in the semiconductor device thus obtained improves markedly. It is important, however, that the space between the regions is sufficient so that any oxygen combined with the implanted oxygen reactive element will not substantially interfere with the electrical properties of the dopant and that the implanted oxygen reactive element should also be in a sufficiently low dose, again, so that it will not substantially interfere with the electrical properties of the dopant.

In the practice of the invention, the implanted oxygen reactive element is introduced through the surface of the III-V compound to form a region beneath the surface. The dopant may then be introduced into the surface above the peak of the implanted oxygen reactive element region. After thermal annealing, the zone between the two regions is substantially oxygen depleted. Alternatively, this oxygen depleted zone also extends from the surface of the dopant region that is opposite the implanted oxygen reactive element region towards and optionally contiguous with the surface of the III-V compound. It is also within the scope of the invention to reverse the order of placement of the dopant and implanted oxygen reactive element or to add or implant them simultaneously.

In one embodiment the implanted oxygen reactive element region is greater than or approximately twice the depth of the dopant layer. Generally, the separation between the implanted oxygen reactive element region and the dopant region is from about 200 Å to about 10,000 Å and especially from about 1,000 Å to about 4,000 Å (N.B. 1 μm = 10,000 Å). The dopant region may be implanted in the device anywhere from about 300 Å to about 5,000 Å and especially from about 200 Å to about 1,000 Å beneath the surface of the III-V compound. The oxygen depleted zone extending from the surface of the dopant layer opposite the gettering layer, may be anywhere from about 0 Å to about 5,000 Å, and especially from about 0 Å to about 3,000 Å.

Again, the invention is not to be limited to the separation of the two dosage peaks of the dopant and implanted oxygen reaction element, since some preliminary data also suggest that these two peaks can overlap or abut one another and some comparable electrical activation and mobility of the electrons in the channel obtained, provided that the oxygen reactive element such as Al is kept low i.e. within the ranges set forth herein. In the preferred embodiment of the invention, however, the regions of peak dose of each are maintained at a distance from one another, especially the range of distances specified herein.

The preferred method of forming the implanted oxygen reactive element region and the dopant region is by ion implantation employing conventional operating conditions and apparatus for this process. The depth of the implanted regions are dependent on the energy which the ions of the implanted oxygen reactive element or dopant are injected into the III-V compound. The higher the voltage of the ion implantation apparatus (which can be adjusted), the deeper the implant of the implanted oxygen reactive element or dopant.

Figure 5:
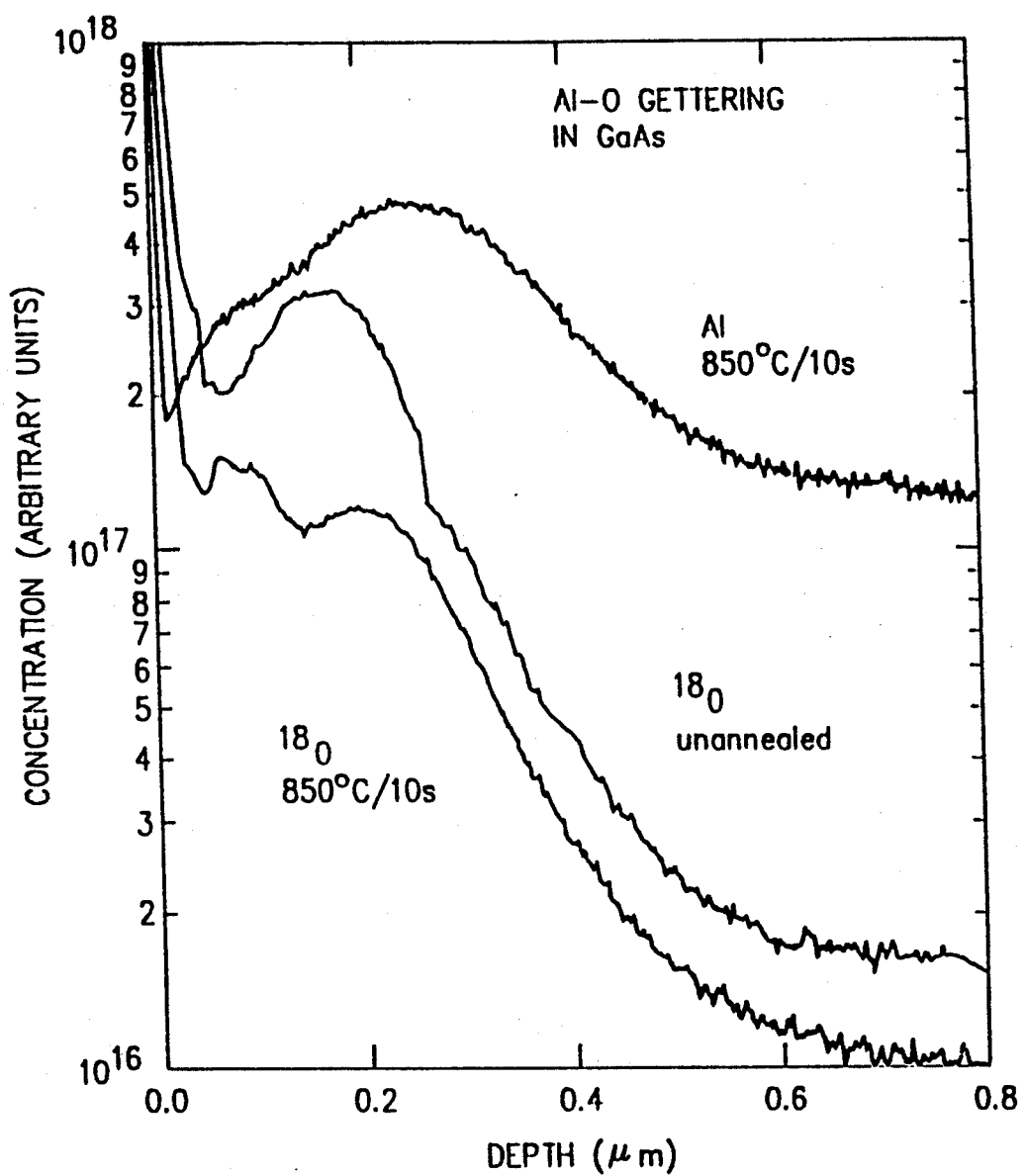
FIG. 5 comprises a plot of the concentration and implant depth of $^{18}$O and Al in a crystalline GaAs substrate (expressed and measured as in FIG. 2) where $^{18}$O is implanted by an ion beam at 67 keV and a dose of 1E13 cm$^{-2}$ and Al implanted by an ion beam at 200 keV and a dose of 1E13 cm$^{-2}$ both with and without RTA annealing at 850° C./10 s.

Subsequent to the formation of the dopant regions and the implanted oxygen reactive element regions by ion implantation, the III-V compound is annealed in order to repair any damage to the crystalline structure of the III-V compound that results from the ion implantation process. It is believed that the oxygen in the III-V compound is mobile such as shown in FIG. 5 during annealing and will be brought into contact with and react with the implanted oxygen reactive element during this process. The annealing may be conducted preferably in one step or after each region is formed (whether implanted oxygen reactive element region or dopant region). In any event, annealing temperatures greater than about 600° C. are utilized over a period of time from about 2 to about 60 seconds and especially a temperature from about 600° C. to about 1000° C. for a period of time from about 2 to about 10 seconds is employed.

The various III-V compounds that may be treated according to the method of the invention are those based on Group IIIA of the Periodic Table of the Elements and Group VA from the Periodic Table of the Elements such as GaAs, InAs, GaP or InP and their art known equivalents.

The various dopants that may be employed comprise, Si, Ge, Sn, Se and Te and at a range of doses from about 1E12 cm$^{-2}$ to about <2E13 cm$^{-2}$ and especially from about 4E12 cm$^{-2}$ to about <1E13 cm$^{-2}$.

The implanted oxygen reactive element suitable for practicing the method of the present invention include B, Mg, Al, Be, Ti, Cr, Fe and Mn.

As noted previously, when the implanted oxygen reactive element is present in doses that are excessive, they interfere with the electrical properties of the dopant and therefore the doses have to be carefully controlled to avoid this problem. It has been found that the implanted oxygen reactive element dose should be less than about 1E13 cm$^{-2}$ and especially from less than about 4.5E12 cm$^{-2}$ to about 1.5E12 cm$^{-2}$.

These amounts of implanted oxygen reactive elements are especially effective according to the present invention where the concentration of oxygen in the III-V compound is from about 1E15 cm$^{-3}$ to about 1E17 cm$^{-3}$ and especially from about 1E15 cm$^{-3}$ to about 1E16 cm$^{-3}$, i.e. minor amounts of oxygen. The invention is especially useful in the preparation of III-V semiconductor materials having oxygen concentrations at a level of about <1E17 cm$^{-3}$ as is found in semiconductor grades of GaAs.

Typically, aluminum dosages slightly less than 1E13 cm$^{-2}$ are ion implanted at 160 keV and up to a depth of about 0.2–0.3 microns in a GaAs substrate followed by implantation of Si at a voltage of less than 50 keV form an oxygen reactive element region and a dopant region in the GaAs compound. The implanted substrate is then subjected to a rapid thermal anneal without a cap at 900° C. or below for a period of time from about 10 to about 60 seconds. The dopant region such as Si may be at the surface of the III-V compound or from about 500 Å to about 2,000 Å from the implanted oxygen reactive element region so that an oxygen depleted zone also extends from the surface of said dopant opposite the implanted oxygen reactive element region.

Previous attempts at the formation of an implanted Al region and a dopant region in the substrate resulted in the degradation of both the electrical activity and mobility of the electrons in the semiconductor device thus produced. These problems were encountered where the dose of each of the Al and the dopant was greater than about 1E13 cm$^{-2}$. Farley et al. (supra) describe the electrical properties of GaAs doped with Si at 1E14 cm$^{-2}$ and co-implanted with Al at 1E14 cm$^{-2}$. Donor activation of Si implants decreased with these doses, as determined from the sheet carrier dose in room temperature Hall effect measurements.

The following examples are illustrative.

EXAMPLE 1

Experiments were conducted to optimize annealing conditions of a GaAs crystal doped with Si, Se and Te to determine what RTA conditions would give the best electrical data. A semiconductor grade of GaAs crystal was implanted with the dopant and the Al employing standard ion-beam implantation methods and apparatus, the doses and ion-beam voltage for each being determined along with the RTA conditions, the sheet resistivity $R_s$, the mobility of the carrier $\mu$ cm$^2$/volt seconds, the sheet carrier concentration $N_s$ (compared to the electron dose) and the threshold voltage, $V_t$ measured by the C-V method which is a measure of voltage to turn a MESFET off. It has been found that a higher annealing temperature is required as the mass of the dopant ion increases to achieve optimum enhancement and electrical activation. For example, for Si, temperatures ranging from about 850° C. to about 875° C. is the best temperature range whereas for Se and Te the temperature ranges are from about 925 to about 950° C. and about 950° to about 1,000° C. respectively. In the case of Te, the Al dose should be less compared to the Al dose employed in the Si or Se runs. Further experimental data indicate that the Se dose should not be greater than 2E13 cm$^{-2}$. The results of experiment 1 (with the exception of the data supporting the Se dose at no greater than 2E13 cm$^{-2}$) is set forth in Table 1.

TABLE 1

| Dopant-Al Co-Implants vs. Annealing Temperature | | | | | |
|---|---|---|---|---|---|
| | Hall | | | | C-V |
| T (°C.) | t (s) | $R_s$ ($\Omega/\square$) | $\mu$ (cm$^2$/v-s) | $N_s$ ($\times 10^{12}$ cm$^2$) | $V_t$ (V) |
| Si, 6E12 cm$^{-2}$ | 850 | 10 | 1472 | 2995 | 1.41 | 1.60 |
| 30 keV + Al, | 875 | " | 1453 | 3117 | 1.38 | 1.69 |
| 4.5E12 cm$^{-2}$ | 900 | " | 1991 | 3188 | 0.98 | 1.26 |
| 160 keV | 925 | " | 7845 | 2792 | 0.28 | 0.46 |
| Se, 7E12 | 875 | 10 | 2910 | 2610 | 0.82 | 0.83 |
| cm$^{-2}$, 60 | 925 | 5 | 1747 | 2570 | 1.39 | 1.15 |
| 60 keV + | 950 | 2 | 1839 | 2580 | 1.31 | 1.27 |
| Al, 4.5E12 | | | | | | |
| cm$^{-2}$, | | | | | | |
| 160 keV | | | | | | |
| Te, 7E12 | 900 | 12 | — | — | — | — |
| cm$^{-2}$, | 950 | 12 | 9220 | 940 | 0.5 | |
| 60 keV + | 1000 | 5 | 3708 | 2350 | 0.72 | |
| Al 1.5E12 | | | | | | |
| cm$^{-2}$, | | | | | | |

TABLE 1-continued

| Dopant-Al Co-Implants vs. Annealing Temperature | | | | | |
|---|---|---|---|---|---|
| | Hall | | | | C-V |
| T (°C.) | t (s) | $R_s$ ($\Omega/\square$) | $\mu$ (cm$^2$/v-s) | $N_s$ ($\times 10^{12}$ cm$^2$) | $V_t$ (V) |
| 160 keV | | | | | |

EXAMPLE 2

Carrier concentrations-depth profile data measured by the C-V method were obtained by implanting Si and Si with Al in a GaAs crystal by ion beam implantation followed by capless RTA, the experimental conditions and results being reported by way of FIG. 1 which demonstrates that an addition of Al at 160 keV to a dose of 4.5E12 cm$^{-2}$ show a marked improvement in peak carrier concentration. The peak dose improves from about 4E17 cm$^{-3}$ for Si alone to about 5.5.E17 cm$^{-3}$ for the co-implantation of Si with Al. This is significant in that with Si in combination with Al, lower doses of Si are sufficient to achieve the same threshold voltage as with higher Si doses without Al. For devices such as an MESFET, the lowering of the Si dose yields higher mobility in the channel region i.e. the gate and with the higher mobility, a higher speed device is obtained.

EXAMPLE 3

Figure 2:
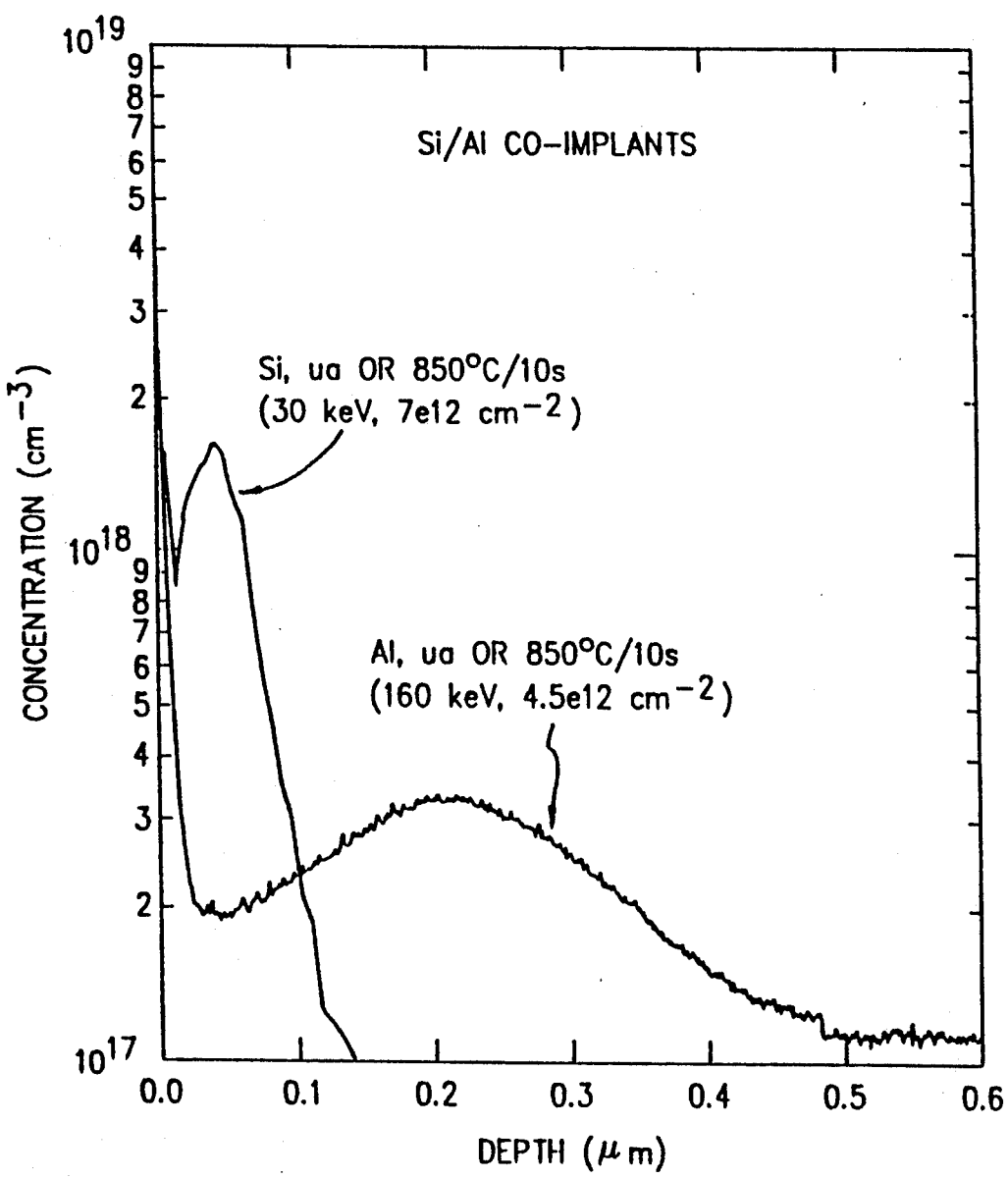
FIG. 2 comprises a plot of the concentration of atoms in cubic centimeters along the y axis (ordinate) obtained by secondary ion mass spectroscopy (SIMS) plotted against the depth in μm (microns) plotted along the x axis (abscissa) of Si and Al in a crystalline GaAs substrate where the silicon is placed in the substrate by ion beam implantation at 30 keV at a dose of 7E12 cm$^{-2}$ unannealed or subject to RTA at 850° C./10 s. Al similarly placed in the crystalline GaAs substrate by ion implantation at 160 keV at a dose of 4.5E12 cm$^{-2}$ unannealed or subjected to RTA at 850° C./10 s is also plotted.

Silicon and Al were co-implanted in a GaAs crystal by ion beam implantation and the Si and Al atomic concentration along with the relative depth distributions determined employing the SIMS method, the results of which are reported in FIG. 2 which also sets forth the ion implantation conditions, concentrations and RTA conditions.

It can be seen from FIG. 2 that the peak concentration of the Al implant is at about 0.2 $\mu$m whereas the peak concentration of the Si is at about 0.05 $\mu$m. These concentrations are obtained by employing different ion beam voltages for the Si and Al implants and consequently the so-called regions of Si dopant can be maintained at one level of peak concentration and the regions of Al dopant region obtained at a different concentration, but the regions are separate from one another which is to say that the regions of peak concentration of n-dopant such as Si and the region of peak concentration of the implanted oxygen reactive element are opposite one another and spaced by a measurable difference.

By way of example and by reference to FIG. 2, it can seen that the region of peak concentration of the Si dopant is spaced about 0.15 $\mu$m from the region of peak concentration of the implanted Al even though there is some overlap between the two.

In comparing FIGS. 1 and 2, it can be seen that the maximum carrier concentration is obtained at a depth of about 0.05 $\mu$m which is not the maximum concentration of implanted Al which is at about 0.2 $\mu$m.

It is believed that this and other data (reported in FIG. 5) support the conclusion that an oxygen depleted zone is formed between the n-dopant region and the implanted oxygen reactive element region, and is attributable to the oxygen gettering action of the implanted oxygen reactive element which extends from the surface of the GaAs crystal to a depth beyond the n-dopant depth.

In any event, when the implantation of the n-dopant and the III element is effected in a manner such as that set forth in this experiment and as illustrated by FIG. 2, the electrical activation and mobility of the electrons in the III-V semiconductor thereby produced, improves markedly, and in some instances more than about 20%.

EXAMPLE 4

Figure 3:
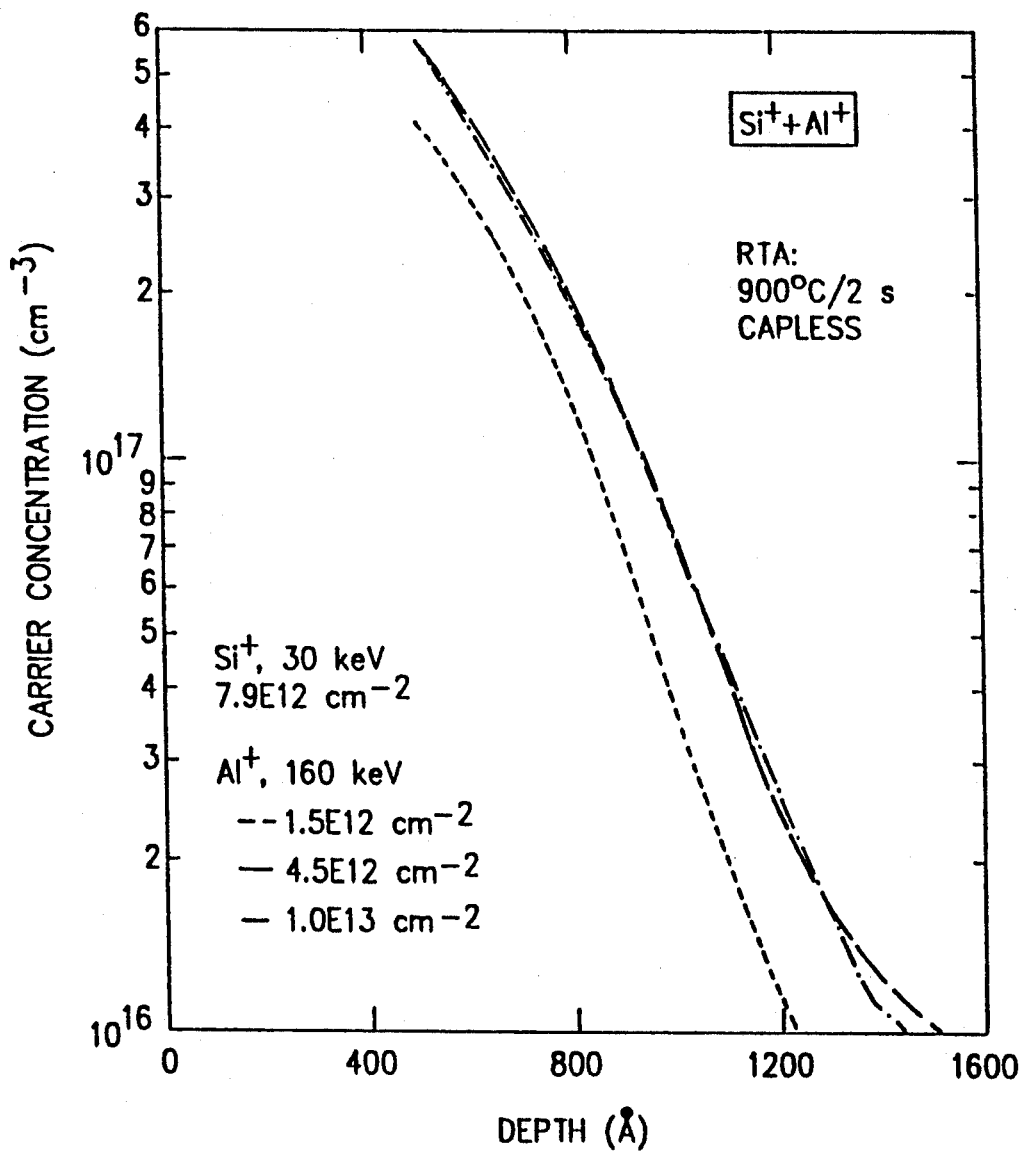
FIG. 3 comprises a plot of carrier concentration versus depth in Å (expressed and measured as in FIG. 1) of co-implants of Si and Al by ion beam implantation where the Si was injected at 30 keV, and a dose at 7.9E12 cm$^{-2}$ into a GaAs crystal followed by RTA at 900° C./2 s employing a capless method. Al at 160 keV at doses of 1.5E12 cm$^{-2}$, 4.5E12 cm$^{-2}$ and 1.0E13 cm$^{-2}$ is also plotted.

The method of Example 2 was repeated at different Al doses to determine the concentration limit of the Al co-implants. The carrier concentration increases with Al doses of 1.5E12 cm$^{-2}$ and 4.5E12 cm$^{-2}$ at 160 keV but then deteriorates at higher Al doses i.e. at 1E13 cm$^{-2}$. The experimental conditions and results are set forth in FIG. 3 where all curves are for Si co-implanted with Al. This is in agreement with the Farley, et al. (supra) data where the Al doses are higher than 1E13 cm$^{-2}$.

EXAMPLE 5

Figure 4:
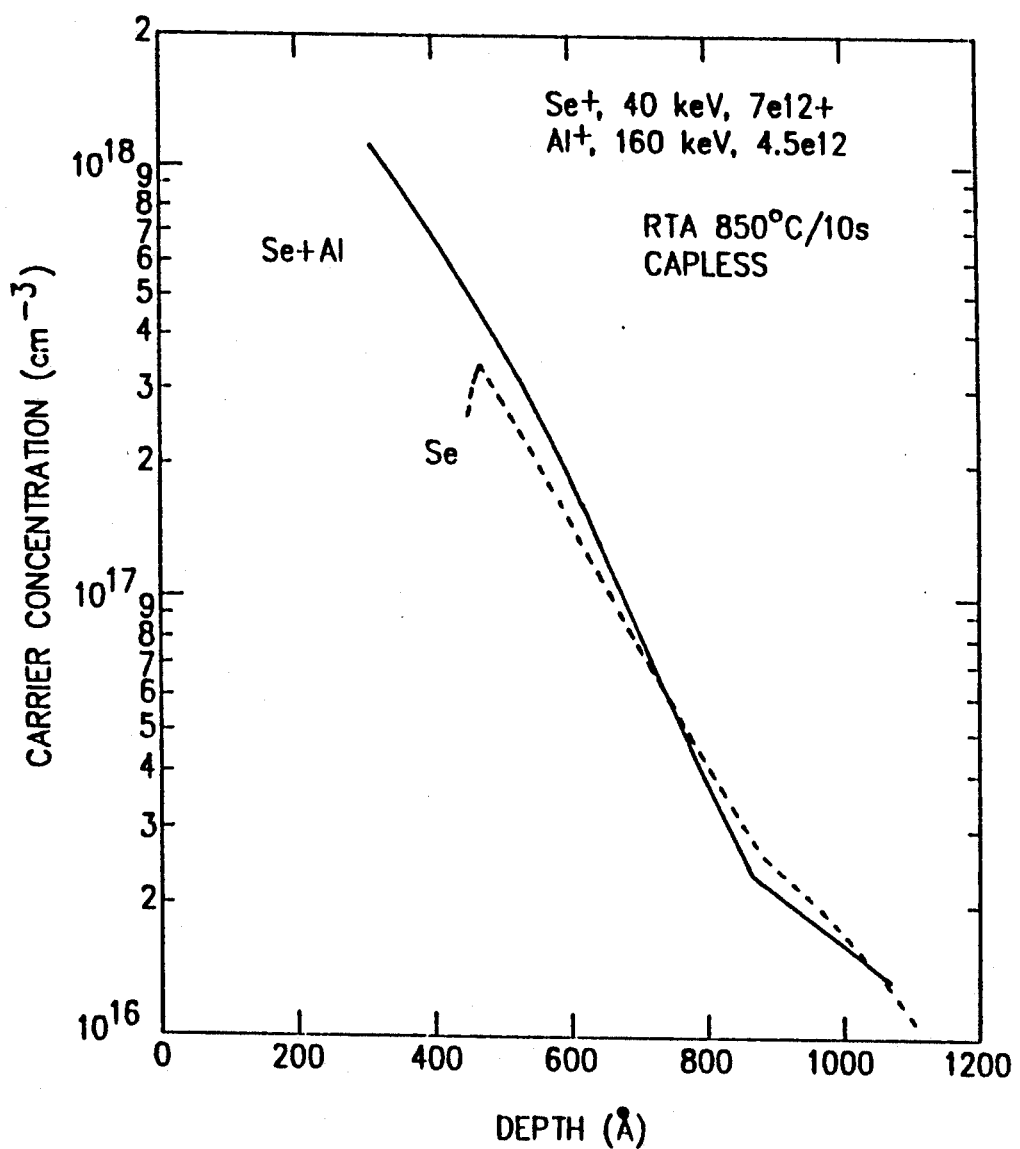
FIG. 4 comprises a plot of carrier concentration and the depth in Å (expressed and measured as for FIG. 1) for the implant of Se at 40 keV by ion beam implantation to a dose of 7E12 cm$^{-2}$ into a crystalline GaAs substrate. This is compared to the co-implantation of Se and Al by ion beam implantation where the Se is implanted as before and the aluminum implanted at 160 keV to a dose of 4.5E12 cm$^{-2}$ employing an RTA at 850° C./10 sec. capless method.

The method of Example 2 was repeated using Se as a n-dopant the experimental conditions employed and the results being set forth in FIG. 4. The increase in carrier concentration is improved by about one order of magnitude by the co-implantation of Al (4.5E12 cm$^{-2}$) with Se (7E12 cm$^{-2}$) as compared to Se alone.

EXAMPLE 6

The atomic distribution of Al and $^{18}$O before and after capless RTA annealing at 850° C. was investigated.

Because the SIMS method is marginally sensitive to oxygen of atomic weight 16, the investigation of the effect of Al implantation in III-V crystals was undertaken by the ion-implantation of $^{18}$O into the crystal at 67 keV and a dose of 1E13 cm$^{-2}$; whereas Al was ion-beam implanted at 200 keV and a dose of 1E14 cm$^{-2}$, where both annealed (capless RTA) and unannealed $^{18}$O and Al layers were analyzed by the SIMS method. The conditions employed and the results obtained are shown in FIG. 5 which clearly illustrate that after annealing the region of peak concentration of $^{18}$O between about 0.1 and 0.2 $\mu$m decreases markedly. It is believed that these data illustrate that an oxygen depleted zone can be formed by the oxygen diffusion during the annealing in the presence of the Al. This supports the conclusion that the oxygen depleted zone in some way contributes to the improvement in electrical activation and mobility of the electrons in the III-V semiconductor device thus obtained.

Although a capless anneal has been employed in conducting the various experiments relating to the present invention, this was an expedient to avoid introducing impurities into the III-V substrates when employing plasma-enhanced chemical vapor deposited (PECVD) silicon nitride caps formed from silane and ammonia. This is further described by DeSouza et al., *Appl. Phys. Lett.*, Vol. 57, (11), Sept. 10, 1990, pp. 1129-31 which is incorporated herein by reference. Either a capless or capped RTA method can be employed according to the invention so long as there is no problem with the introduction of contaminants into the substrate.

In order to determine whether the improved electrical activation and mobility of the electrons in the III-V semiconductor thus obtained was attributable to damage caused by the ion-beam implantation of Al into the crystal, experiments were undertaken with Ne implantations to damage the GaAs crystal but no measurable improvements in the electrical properties of the crystal were observed. It was therefore concluded that the improvements obtained in electrical activation and mobility were due to the co-implantation of the n-dopant with the implanted oxygen reactive element according to the method of the invention and the gettering effect obtained with the implanted oxygen reactive element. The experiment with Ne implantation followed those of Example 6 and unlike the case with Al implantation, an oxygen depleted zone was not formed.

Additional data indicate that when the GaAs crystal is implanted with Si by ion implantation at 30 keV and a dose of 7.9E12 cm$^{-2}$ and co-implantation of Al at 160 keV at doses ranging from 1.5E12 cm$^{-2}$, 4.5E12 cm$^{-2}$, 1.0E13 cm$^{-2}$ and 5.0E13 cm$^{-2}$ that the sheet resistance increases unacceptably at the two highest Al doses. Accordingly the upper limit of the implanted oxygen reactive element appears to be about 4.5E12 cm$^{-2}$ at these n-dopant levels.

It has also been found that where the Si dose in the GaAs is 4.5E13 cm$^{-2}$ to 1E14 cm$^{-2}$, Al doses of 4.5E12 cm$^{-2}$ do not affect the electrical properties of the GaAs semiconductor thus obtained in any significant way. It appears therefore that the addition of Al at these higher doses neither deteriorates nor improves the Si electrical activation in GaAs which is acceptable from the point of view of device fabrication. In the manufacture of a MESFET, therefore, it is not necessary to define regions of Al if Si doses are to be changed. Thus, if a MESFET device is fabricated from a III-V crystal such as GaAs, regions under the source and drain electrode can be doped with Si in doses of about 4.5E13 cm$^{-2}$ whereas the channel region (i.e. the gate region) in between the source and drain regions can be doped with Si at lower doses e.g. about 4-7E12 cm$^{-2}$. A blanket Al implant over the gate region can be effected within the limits of the present invention to obtain increased electrical activation and mobility of the electrons in the channel without disturbing the electrical activation and mobility of the source region and the drain region.

Although the invention has been described by reference to some embodiments, it is not intended that the novel method and article of manufacture obtained thereby are to be limited, but that modifications thereof are intended to be included as falling within the scope and spirit of the foregoing disclosure, the following claims and the attached drawings.

Having thus described our invention, what we claim as new, and desire to secure by Letters Patent is:

1. A method of manufacturing a III-V semiconductor composition containing minor amounts of oxygen as an impurity, comprising placing an n-dopant by ion implantation in said III-V compound in an amount from about 4E12 cm$^{-2}$ to less than about 2E13 cm$^{-2}$ to form a dopant region and placing an oxygen reactive element by ion implantation in said III-V compound in an amount from about 1.5E12 cm$^{-2}$ to about 4.5 E12 cm$^{-2}$ to form an oxygen reactive element region so that said regions are separated from one another in said III-V compound.

2. The method of claim 1 where said n-dopant is in an amount from about 4E12 cm$^{-2}$ to less than about 1E13 cm$^{-2}$ and said oxygen reactive element is present in an amount less than said dopant.

3. The method of claim 1 where said regions are separated from one another by about 0.5 to about 0.25 μm.

4. The method of claim 3 where said regions are separated from one another by about 0.1 to about 0.2 μm.

5. The method of claim 3 where oxygen is present in said III-V compound in an amount less than about 1E17 cm$^{-3}$.

6. The method of claim 2 wherein said III-V compounds are GaAs, InAs, GaP or InP.

7. The method of claim 6 wherein said dopants are:

| | |
|---|---|
| Si | Se |
| Ge | Te |
| Sn | |

8. The method of claim 7 wherein said oxygen reactive element are Be, Mg, Al, B, Ti, Cr, Fe or Mn.

9. The method of claim 8 where said n-dopant and said oxygen reactive element are ion implanted into said III-V compound.

10. The method of claim 9 further comprising annealing said III-V compound at a temperature greater than about 600° C. up to about 1000° C. to maximize carrier speed and sheet carrier dose and minimize surface resistivity after said n-dopant and said oxygen reactive element are ion implanted into said III-V compound.

11. A method of gettering oxygen from a III-V compound containing minor amounts of oxygen as an impurity comprising placing an n-dopant in said III-V compound to form a dopant region in a space in said III-V compound through which an oxygen reactive element is implanted to form an opposed oxygen reactive element region in said III-V compound, combining said oxygen reactive element with said oxygen to form an oxygen depleted zone between said regions, the space between said regions being sufficient so that oxygen combined with said oxygen reactive element will not substantially interfere with the electrical properties of said dopant, said oxygen reactive element being in a sufficiently low dose so that it will not substantially interfere with the electrical properties of said dopant.

12. The method of claim 11 where said dopant region and said oxygen reactive element region are ion implanted into said III-V compound.

13. The method of claim 12 comprising annealing said III-V compound at a temperature from greater than about 600° C. for a period of time from about 2 to about 60 seconds after said dopant region and said oxygen reactive element region are formed in said III-V compound.

14. The method of claim 12 wherein said III-V compounds are GaAs, InAs, GaP or InP.

15. The method of claim 14 wherein said dopants are:

| | |
|---|---|
| Si | Se |
| Ge | Te |
| Sn | |

16. The method of claim 15 wherein said oxygen reactive elements are Be, Mg, Al, B, Ti, Cr, Fe or Mn.

17. The method of claim 16 wherein said dopant region and said oxygen reactive element are ion implanted into said III-V compound.

18. The method of claim 19 further comprising annealing said III-V compound at a temperature greater than about 600° C. to about 1000° C. to maximize carrier speed and sheet carrier dose and minimize surface resistivity after said dopant region and said oxygen reactive element region are ion implanted into said III-V compound.

19. The method of claim 18 where said oxygen reactive element dose is less than about 1E13 cm$^{-2}$.

20. The method of claim 19 where said oxygen reactive element and said dopant are implanted in said III-V compound at different depths in a range of depths from about 0.2 to about 0.3 μm and subjected to a rapid thermal anneal without a cap region at about 900° C. from about 10 to about 60 seconds.

21. The method of claim 4 wherein said III-V compounds are GaAs or InAs, said dopant is Si and said oxygen reactive element is Al.

22. The method of claim 11 wherein said III-V compounds are GaAs or InAs, said dopant is Si and said oxygen reactive element is Al.

* * * * *

UNITED STATES PATENT AND TRADEMARK OFFICE
CERTIFICATE OF CORRECTION

PATENT NO. : 5,183,767
DATED : February 2, 1993
INVENTOR(S) : Devendra K. Sadana, et al.

It is certified that error appears in the above-identified patent and that said Letters Patent is hereby corrected as shown below:

Abstract, line 10, "respecitvely" should read --respectively--.
        Column 1, line 49: after "12," insert --No. 11--
        Column 1, line 60: after "16," insert --No. 4--
        Column 2, line 4: after "19," insert --No. 11--
        Column 3, line 32: "(A)" should read --($\overset{o}{A}$)--
        Column 8, line 17: "IE14" should read as

--1E14--

Signed and Sealed this

Fourth Day of January, 1994

Attest:

BRUCE LEHMAN

*Attesting Officer*      *Commissioner of Patents and Trademarks*